United States Patent
Kitada et al.

(10) Patent No.: US 12,285,946 B2
(45) Date of Patent: Apr. 29, 2025

(54) DROPLET DISCHARGE HEAD AND DROPLET DISCHARGE APPARATUS

(71) Applicant: SEIKO EPSON CORPORATION, Tokyo (JP)

(72) Inventors: Kazuya Kitada, Nagano (JP); Yoichi Tanaka, Nagano (JP); Takayuki Yokoyama, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 247 days.

(21) Appl. No.: 18/186,983

(22) Filed: Mar. 21, 2023

(65) Prior Publication Data
US 2023/0302817 A1 Sep. 28, 2023

(30) Foreign Application Priority Data
Mar. 23, 2022 (JP) .................. 2022-046252

(51) Int. Cl.
| | |
|---|---|
| *B41J 2/14* | (2006.01) |
| *B41J 2/045* | (2006.01) |
| *B41J 2/15* | (2006.01) |
| *G06K 15/10* | (2006.01) |

(52) U.S. Cl.
CPC ....... *B41J 2/14233* (2013.01); *B41J 2/04541* (2013.01); *B41J 2/15* (2013.01); *G06K 15/105* (2013.01)

(58) Field of Classification Search
CPC .................................................... B41J 2/2132
See application file for complete search history.

(56) References Cited

U.S. PATENT DOCUMENTS

| | | | |
|---|---|---|---|
| 2010/0259574 A1 | 10/2010 | Sumi | |
| 2012/0092404 A1* | 4/2012 | Marumoto | ............ B41J 25/001 347/15 |
| 2014/0145555 A1* | 5/2014 | Kurachi | ............... B41J 2/14233 310/311 |
| 2017/0036445 A1* | 2/2017 | Higashibeppu | ...... B41J 2/14201 |
| 2021/0237477 A1* | 8/2021 | Takekoshi | ............ B41J 2/16508 |

(Continued)

FOREIGN PATENT DOCUMENTS

JP 2014-058169 A 4/2014

*Primary Examiner* — Shelby L Fidler
(74) *Attorney, Agent, or Firm* — Global IP Counselors, LLP (57) ABSTRACT

A droplet discharging head executes multi-path recording in which dot recording in one main scanning line is completed by n main scans when n is an integer of 2 or more. The droplet discharging head includes: a plurality of nozzles configured to discharge a liquid as droplets; a pressure chamber defining substrate defining a pressure chamber communicating with the nozzles; a piezoelectric element including a first electrode, a second electrode, and a piezoelectric layer containing a perovskite-type composite oxide containing K, Na, and Nb as a main component; and a vibration plate forming a part of a wall surface of the pressure chamber and configured to vibrate by driving of the piezoelectric element. The number of paths n in the multi-path recording, a piezoelectric constant $d_{31}$ [m/v] of the piezoelectric element, and a ratio x of a Na molar fraction to a total value of a K molar fraction and the Na molar fraction in the piezoelectric layer satisfy a relationship represented by a formula (1).

6 Claims, 7 Drawing Sheets

| RANGE | IMAGE QUALITY EVALUATION RESULT | LIFE EVALUATION RESULT |
|---|---|---|
| $P_1 < 8.0 \times 10^{-8}$ | D | D |
| $8.0 \times 10^{-8} \leq P_1 \leq 9.6 \times 10^{-8}$ | B | C |
| $9.6 \times 10^{-8} < P_1$ | D | D |

(56) References Cited

U.S. PATENT DOCUMENTS

| | | | |
|---|---|---|---|
| 2021/0408361 A1* | 12/2021 | Hamada | B41J 2/14233 |
| 2022/0149266 A1* | 5/2022 | Tabata | B41J 2/14209 |
| 2022/0158076 A1* | 5/2022 | Hirayama | B41J 2/14233 |
| 2023/0131275 A1* | 4/2023 | Hirayama | B41J 2/14233 310/358 |

\* cited by examiner

| RANGE | IMAGE QUALITY EVALUATION RESULT | LIFE EVALUATION RESULT |
|---|---|---|
| $P_1 < 8.0 \times 10^{-8}$ | D | D |
| $8.0 \times 10^{-8} \leqq P_1 \leqq 9.6 \times 10^{-6}$ | B | C |
| $9.6 \times 10^{-6} < P_1$ | D | D |

FIG. 8

| RANGE | IMAGE QUALITY EVALUATION RESULT | LIFE EVALUATION RESULT |
|---|---|---|
| $P_2 < 8.0 \times 10^{-9}$ | B | C |
| $8.0 \times 10^{-9} \leqq P_2 \leqq 1.9 \times 10^{-5}$ | A | C |
| $1.9 \times 10^{-5} < P_2$ | D | D |

FIG. 9

| RANGE | IMAGE QUALITY EVALUATION RESULT | LIFE EVALUATION RESULT |
|---|---|---|
| $P_3 < 8.0 \times 10^{-9}$ | B | C |
| $8.0 \times 10^{-9} \leqq P_3 \leqq 1.9 \times 10^{-5}$ | B | A |
| $1.9 \times 10^{-5} < P_3$ | D | D |

DROPLET DISCHARGE HEAD AND DROPLET DISCHARGE APPARATUS

The present application is based on, and claims priority from JP Application Serial Number 2022-046252, filed Mar. 23, 2022, the disclosure of which is hereby incorporated by reference herein in its entirety.

BACKGROUND

1. Technical Field

This disclosure relates to a droplet discharge head and a droplet discharge apparatus.

2. Related Art

With regard to a droplet discharge head, JP-A-2014-58169 discloses a head that includes a piezoelectric element mainly made of lead zirconate titanate (PZT) and discharges a liquid as droplets.

In a piezo-type droplet discharge head, a non-lead based piezoelectric material having a reduced lead (Pb) content, which is substituted for PZT, is desired from the viewpoint of reducing an environmental load. In such a non-lead based piezoelectric material, it is known that potassium sodium niobate (KNN)-based materials have relatively excellent piezoelectric characteristics. Here, a displacement amount of the KNN-based material during voltage application is generally smaller than that of PZT. Accordingly, when the KNN-based material is used as the piezoelectric material of the droplet discharge head, a discharge amount of the droplet per time is small even when the same voltage is applied. In addition, the KNN-based material has higher temperature dependence of the displacement amount than that of PZT, and is likely to generate a leakage current due to a temperature rise. For this reason, for example, when a driving frequency is simply increased in order to implement a desired discharge amount in total, the deterioration of image quality and shortening of a life of the droplet discharge head may be caused by the temperature rise due to the increase of the driving frequency. Therefore, when the KNN-based material is used as the piezoelectric material of the droplet discharge head, it is conceivable to reduce the driving frequency by performing so-called multi-path recording in which dot recording on one main scanning line is completed by a plurality of main scans. However, in this case, it is not sufficiently studied to implement good image quality and long life of the droplet discharge head by considering characteristics of the KNN-based material and the number of paths in the main scan.

SUMMARY

According to a first aspect of the present disclosure, there is provided a droplet discharge head that executes, between sub scans in which a medium is conveyed in a sub scanning direction intersecting a main scanning direction, a main scan in which droplets are discharged onto a main scanning line by movement in the main scanning direction with respect to the medium, thereby performing multi-path recording in which dots are formed in the medium and dot recording in the main scanning line is completed by n main scans when n is an integer of 2 or more. The droplet discharge head includes: a plurality of nozzles configured to discharge a liquid as the droplets; a pressure chamber defining substrate defining a pressure chamber communicating with the nozzles; a piezoelectric element; and a vibration plate disposed between the pressure chamber defining substrate and the piezoelectric element, forming a part of a wall surface of the pressure chamber, and configured to vibrate by driving of the piezoelectric element. The piezoelectric element includes a first electrode, a second electrode, and a piezoelectric layer disposed between the first electrode and the second electrode, the piezoelectric layer containing a perovskite-type composite oxide containing potassium, sodium, and niobium as a main component. The number of paths n in the multi-path recording, a piezoelectric constant $d_{31}$ [m/v] of the piezoelectric element, and a ratio x of a sodium molar fraction to a total value of a potassium molar fraction and the sodium molar fraction in the piezoelectric layer satisfy a relationship represented by a following formula (1).

$$8.0\times10^{-8} \le n \cdot d_{31} \cdot x \le 9.6\times10^{-6} \quad (1)$$

A second aspect of the present disclosure provides a droplet discharge apparatus. The droplet discharge apparatus includes: the droplet discharging head of the above aspect; a conveyance mechanism configured to convey the medium in the sub scanning direction; a head moving mechanism configured to support the droplet discharge head and moves the droplet discharge head in the main scanning direction; and a control unit configured to control the droplet discharge head, the conveyance mechanism, and the head moving mechanism to execute the multi-path recording.

DESCRIPTION OF EXEMPLARY EMBODIMENTS

A. First Embodiment

Figure 1:
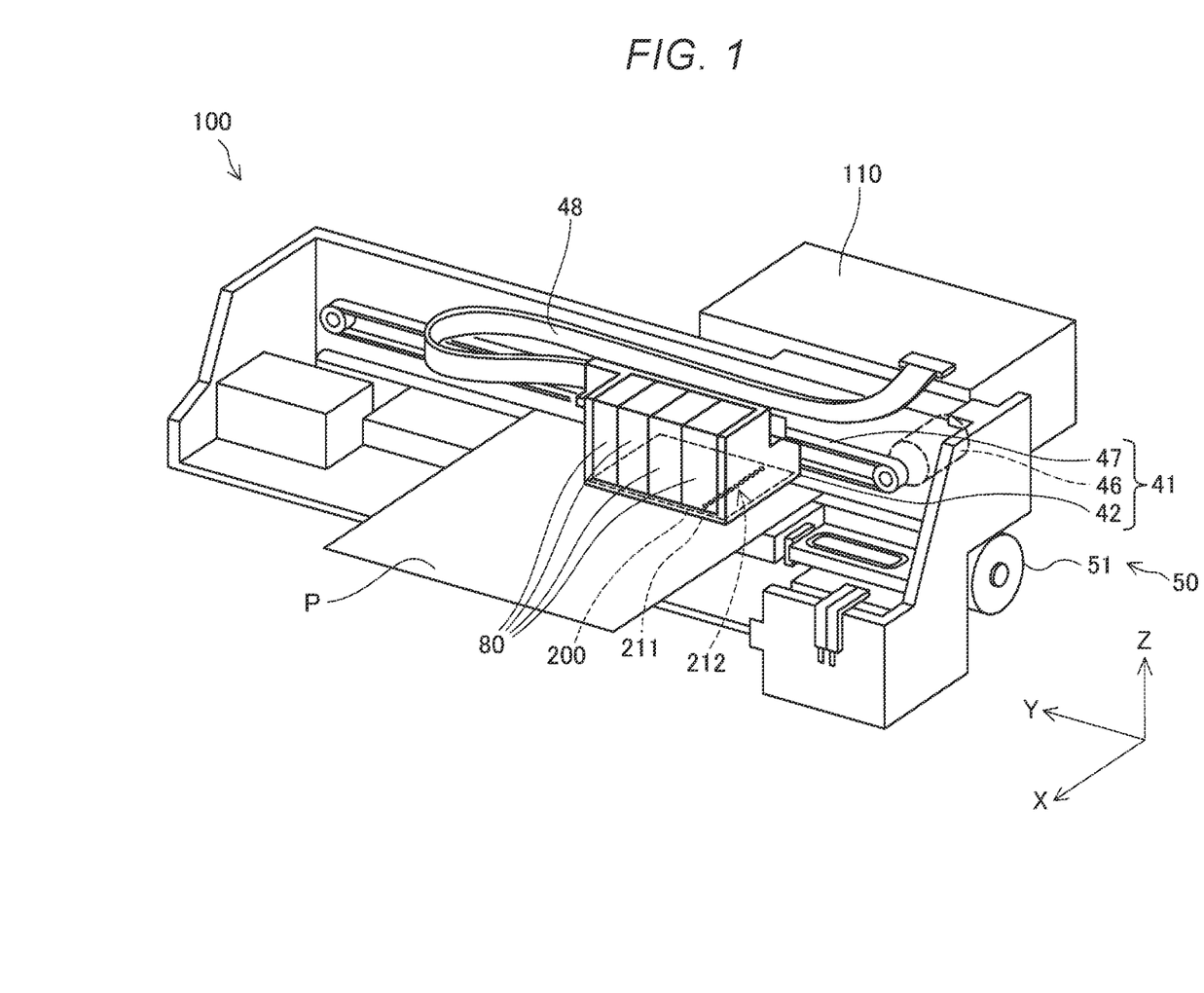
FIG. 1 is a schematic view showing a schematic configuration of a droplet discharge apparatus.

FIG. 1 is a schematic view showing a schematic configuration of a droplet discharge apparatus 100 as a first embodiment. FIG. 1 shows arrows along X, Y, and Z directions which are orthogonal to one another. The X, Y, and Z directions are directions along an X axis, a Y axis, and a Z axis that are three spatial axes orthogonal to one another, and each direction includes a direction on one side along a corresponding one of the X axis, the Y axis, and the Z axis, and a direction opposite thereto. Specifically, positive directions along the X axis, the Y axis, and the Z axis are a +X direction, a +Y direction, and a +Z direction, respectively, and negative directions along the X axis, the Y axis, and the Z axis are a −X direction, a −Y direction, and a −Z direction, respectively. In FIG. 1, the X axis and the Y axis are axes along a horizontal plane, and the Z axis is an axis along a vertical line. Therefore, in the embodiment, the −Z direction is a direction of gravity. In other drawings, arrows along the X, Y, and Z directions are also appropriately represented. The X, Y, and Z directions in FIG. 1 and X, Y, and Z directions in the other drawings represent the same directions. In the present specification, the term "orthogonal" includes a range of 90°±10°.

The droplet discharge apparatus 100 discharges a liquid as droplets. The term "droplet" refers to a state of the liquid discharged from the droplet discharge apparatus 100, and includes granular-shaped droplets with a tail, teardrop-shaped droplets with a tail, and thread-shaped droplets with a tail. The term "liquid" used herein may be any material that can be consumed by the droplet discharge apparatus 100. For example, the "liquid" may be a material when a substance is in a liquid phase, and the "liquid" also includes a material in a liquid state such as a material in a liquid state having a high or low viscosity, and sol, gel water, other inorganic solvents, organic solvents, solutions, liquid resins, and liquid metals such as metal melts. Further, the "liquid" includes not only the liquid as a state of the substance but also a liquid in which particles of a functional material made of a solid substance such as a pigment or a metal particle are dissolved, dispersed or mixed in a solvent. Typical examples of the liquid include ink and a liquid crystal. Here, the ink includes general water-based ink, oil-based ink, and various liquid compositions such as gel ink and hot melt ink.

The droplet discharge apparatus 100 according to the embodiment is an inkjet printer that prints an image on a medium P by discharging the ink as droplets. The droplet discharge apparatus 100 discharges droplets onto the medium P such as paper based on print data indicating ON/OFF of dots to the medium P, and forms dots at various positions on the medium P, thereby printing an image on the medium P. As the medium P, in addition to paper, for example, a material capable of holding a liquid, such as plastic, film, fiber, cloth, leather, metal, glass, wood, or ceramics, can be used.

The droplet discharge apparatus 100 includes a droplet discharge head 200, a head moving mechanism 41, a conveyance mechanism 50, an ink cartridge 80, and a control unit 110.

The control unit 110 is implemented by a computer including one or more processors, a main storage device, and an input and output interface that inputs and outputs a signal to and from outside. The control unit 110 controls the droplet discharge head 200, the head moving mechanism 41, and the conveyance mechanism 50 according to print data, thereby discharging droplets from the droplet discharge head 200 onto the medium P and printing an image on the medium P. That is, the control unit 110 controls a discharge operation of the droplet discharge head 200 that discharges droplets.

The head moving mechanism 41 supports the droplet discharge head 200 and moves the supported droplet discharge head 200 along a main scanning direction. The conveyance mechanism 50 conveys the medium P along a sub scanning direction. In the embodiment, the main scanning direction is a direction along the Y direction, and includes both a direction on one side of the Y direction and a direction opposite thereto. The sub scanning direction is a direction along the X direction, and includes both a direction on one side of the X direction and a direction opposite thereto. That is, in the embodiment, the main scanning direction and the sub scanning direction are orthogonal to each other, but in other embodiments, the main scanning direction and the sub scanning direction may not be orthogonal to each other.

The head moving mechanism 41 in the embodiment includes a carriage 42 that holds the droplet discharge head 200, and a drive motor 46 and a drive belt 47 that drive the carriage 42. The carriage 42 reciprocates along the main scanning direction, that is, along the Y direction, by a driving force transmitted from the drive motor 46 to the carriage 42 via the drive belt 47. As a result, the droplet discharge head 200 reciprocates along the Y direction together with the carriage 42.

The conveyance mechanism 50 in the embodiment includes a conveyance motor 51 and a roller (not shown). The conveyance mechanism 50 conveys the medium P along the sub scanning direction, that is, along the X direction, by the conveyance motor 51 driving the roller. More specifically, in the embodiment, the conveyance mechanism 50 conveys the medium P in the +X direction. Hereinafter, the direction in which the medium P is conveyed by the conveyance mechanism 50 is also referred to as a conveyance direction. In the embodiment, the conveyance direction is the +X direction.

The ink cartridge 80 stores the ink as a liquid to be supplied to the droplet discharge head 200. In the embodiment, four ink cartridges 80 are attachable to and detachable from the carriage 42, and four types of ink having different colors are stored as liquids in the four ink cartridges 80. For example, the ink cartridge 80 may be attached to a main body of the droplet discharge apparatus 100 instead of being attached to the carriage 42. In other embodiments, a mechanism for storing the ink may be, for example, an ink tank, or a bag-shaped liquid pack formed of a flexible film, and a type of the mechanism for storing the ink and the number of mechanisms and a type of the stored ink and the quantity of stored ink are not particularly limited.

The droplet discharge head 200 is electrically coupled to the control unit 110 via a flexible cable 48. The droplet discharge head 200 discharges the ink, in a form of droplets from nozzles 211 constituting a nozzle row 212 described later, supplied from the ink cartridge 80 onto the medium P conveyed along the sub scanning direction on a main scanning line while reciprocating in the main scanning direction. Hereinafter, moving the droplet discharge head 200 in the main scanning direction with respect to the medium P to discharge droplets on the main scanning line is also referred to as a main scan. Conveying the medium P along the sub scanning direction is also referred to as a sub scan. More specifically, the droplet discharge head 200 forms dots on the medium P and records an image on the medium P by performing the main scan between sub scans under the control of the control unit 110. The droplet discharge apparatus 100 may include two or more droplet discharge heads 200.

Figure 2:
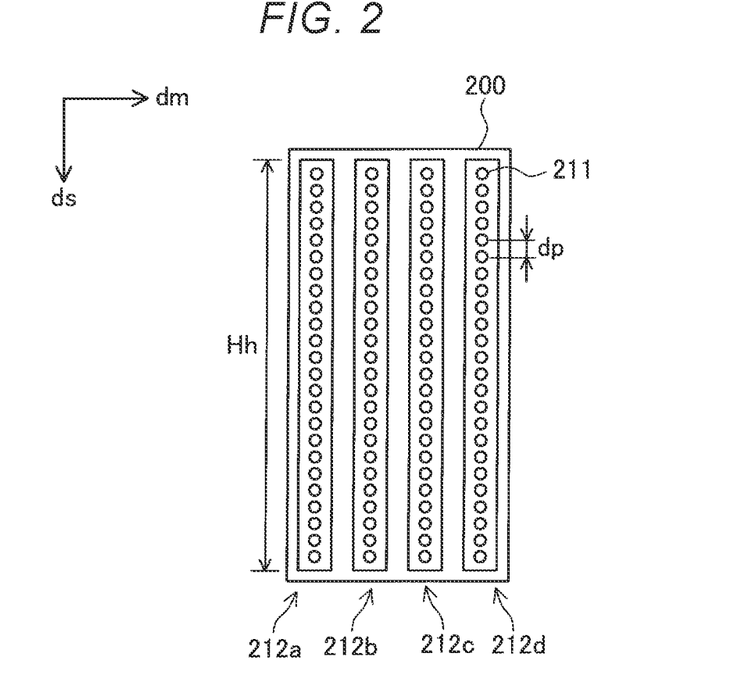
FIG. 2 is a schematic view showing an example of a configuration of a nozzle row.

FIG. 2 is a schematic view showing an example of a configuration of the nozzle row 212 of the droplet discharge head 200. FIG. 2 schematically shows a main scanning direction dm and a sub scanning direction ds. In the example of FIG. 2, the droplet discharge head 200 includes the nozzle rows 212 each for one type of ink. More specifically, four nozzle rows 212a, 212b, 212c, and 212d shown in FIG. 2 correspond to black ink, cyan ink, magenta ink, and yellow ink, respectively. Each of the nozzle rows 212 includes a plurality of nozzles 211 arranged side by side along the sub scanning direction ds at a constant nozzle pitch dp. The plurality of nozzles 211 constituting one nozzle row 212 are also collectively referred to as a "nozzle set". In the embodiment, the nozzle pitch dp is equal to a pixel pitch on the medium P, but in other embodiments, the nozzle pitch dp may be an integral multiple of the pixel pitch on the medium P. In this case, so-called interlace recording is executed. The interlace recording refers to an operation of recording dots in second and subsequent paths so as to fill gaps between dots of main scanning lines recorded in a first path. In other embodiments, the number of nozzle rows 212 may be one to three, or five or more.

Figure 3:
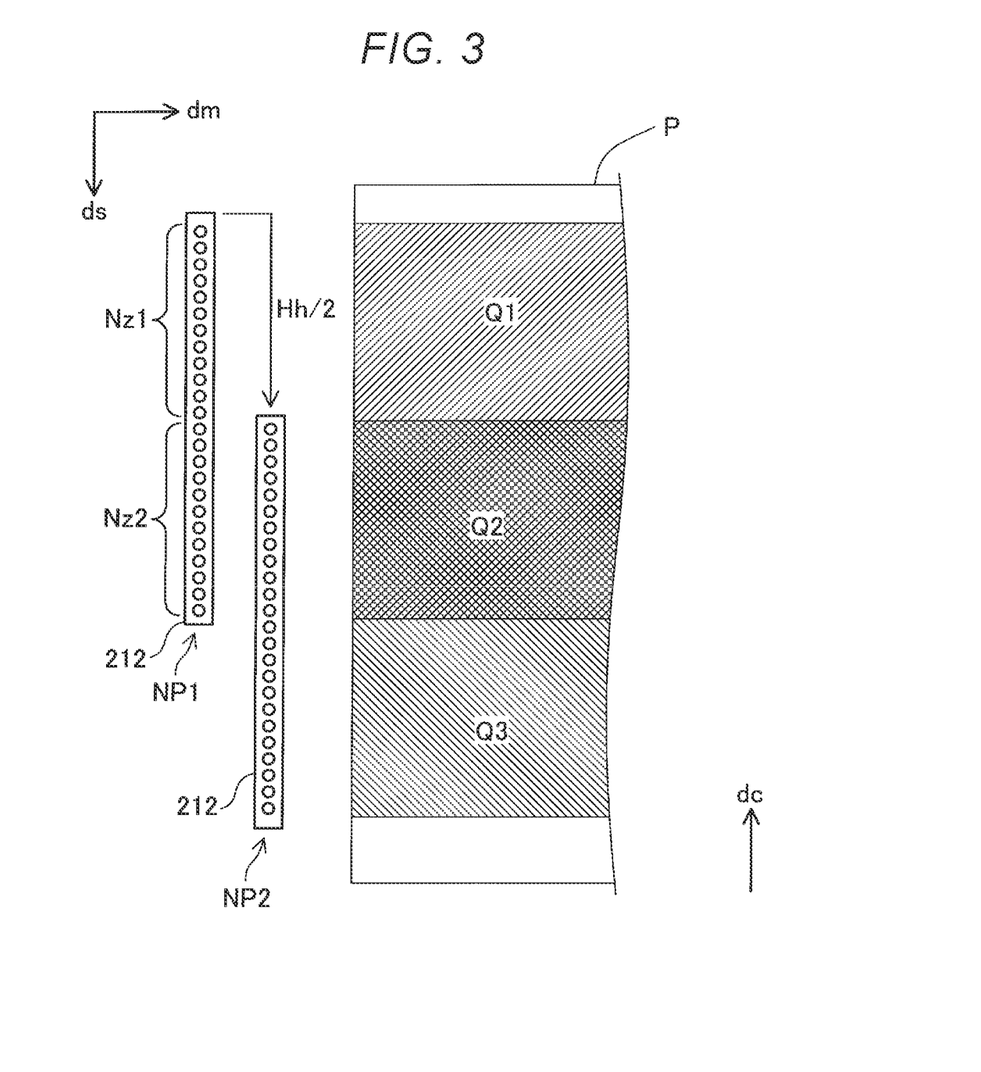
FIG. 3 is a schematic view showing an example of recording dots on a medium.

FIG. 3 is a schematic view showing an example of recording dots on the medium P. FIG. 3 schematically shows a conveyance direction dc in addition to the main scanning direction dm and the sub scanning direction ds similar to those in FIG. 2. FIG. 3 shows an example in which formation of dots on individual main scanning lines is completed in two main scans. In this manner, when n is an integer of 2 or more, a dot recording operation in which formation of dots on individual main scanning lines is completed in n main scans is referred to as "multi-path recording". In the multi-path recording, it can be said that the formation of dots on individual main scanning lines is completed in n main scanning paths, and the number of main scanning paths in this case is also referred to as the number of paths n. A nozzle position NP1 in FIG. 3 indicates a position of the nozzle row 212 in a first main scan of the two main scans for the formation of dots on the individual main scanning lines, and a nozzle position NP2 indicates a position of the nozzle row 212 in a second main scan. In the embodiment, the main scan operation is performed bidirectionally. For example, an odd-numbered main scanning path is executed in a forward path, and an even-numbered main scanning path is executed in a backward path. The multi-path recording is also referred to as "overlap recording".

In one main scan, dots of each type of ink can be recorded on a region having a width of a head height Hh shown in FIG. 2. The "head height Hh" means a length in the sub scanning direction ds represented by a product of the number of nozzles M and the nozzle pitch dp. The number of nozzles M refers to the number of nozzles 211 constituting one nozzle row 212. In the example of FIG. 3, each time one main scan is performed, a position of the nozzle row 212 moves in the sub scanning direction ds by a distance corresponding to 1/n of the head height Hh. The distance Hh/n is also referred to as a "sub scanning feed amount". More specifically, in the example of FIG. 3, the sub scanning feed amount is Hh/2. In FIG. 3, for convenience of illustration, a state in which the nozzle rows 212 are moved in a direction opposite to the conveyance direction dc with respect to the stopped medium P in the sub scan is shown, but in actuality, the medium P is conveyed in the conveyance direction dc when the nozzle rows 212 are stopped. A portion of the nozzle row 212 that reaches the medium P earliest in the sub scan is referred to as a "front end" of the nozzle row 212, and an opposite side of the nozzle row 212 from the "front end" is referred to as a "rear end". The entire length of the nozzle row 212 can be virtually divided into n nozzle groups from a front end side toward a rear end side. That is, in the example of FIG. 3, the entire length of the nozzle row 212 can be virtually divided into a first nozzle group Nz1 and a second nozzle group Nz2.

Three regions Q1 to Q3 on the medium P shown in FIG. 3 are regions in which dot recording is executed by the first nozzle group Nz1 and the second nozzle group Nz2 of the nozzle row 212 in the main scan with two paths. Among these regions, in the region Q1 located at an uppermost side in FIG. 3, dots are recorded using the first nozzle group Nz1 in a first main scanning path. At this time, dots are recorded at none of pixel positions included in the region Q1 in one path, and the dot recording is executed according to a recording ratio set in advance. Thereafter, in the region Q1, dots are recorded using the second nozzle group Nz2 in a second main scanning path. By these two paths, the dot recording at all pixel positions in the region Q1 is completed. In the other regions Q2 and Q3 and other regions below the region Q3 in FIG. 3, the dot recording is similarly completed in two paths. A length of each of the regions Q1 to Q3 in the sub scanning direction ds is Hh/n. These regions Q1 to Q3 are also referred to as "band regions". In the present specification, the "dot recording" means "executing formation of dots or non-formation of dots". That is, for example, a state in which "the dot recording is completed" on a certain main scanning line refers to a state in which either the formation of dots or the non-formation of dots is executed at all pixel positions on the main scanning line.

Figure 4:
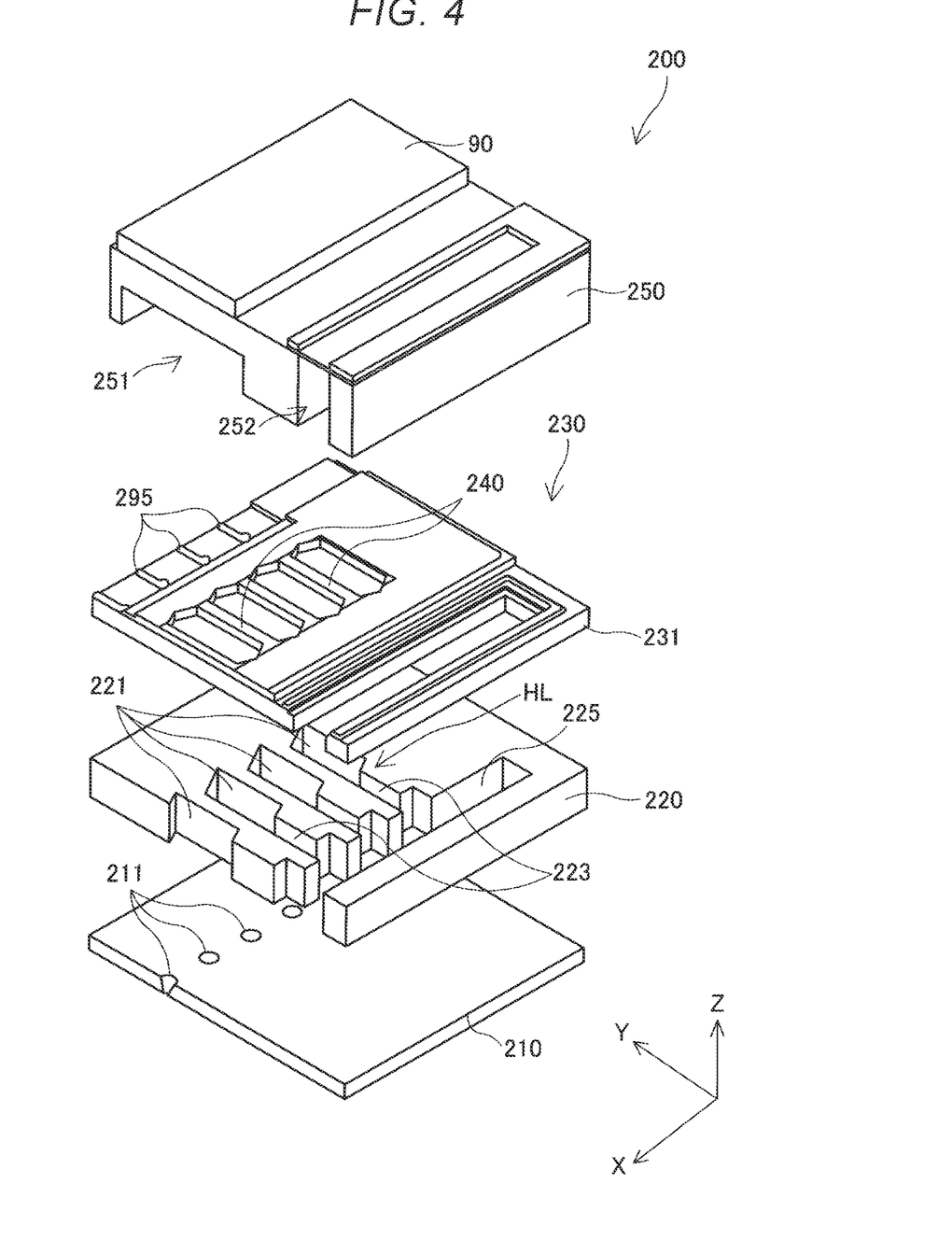
FIG. 4 is an exploded perspective view showing a configuration of a droplet discharge head.

FIG. 4 is an exploded perspective view showing a configuration of the droplet discharge head 200 according to the embodiment. The droplet discharge head 200 in the embodiment is formed by stacking a nozzle plate 210, a pressure chamber defining substrate 220, a piezoelectric portion 230, and a sealing portion 250 in the Z direction. A drive circuit 90 is provided on a surface of the sealing portion 250 on a +Z direction side.

The nozzle plate 210 in the embodiment is a thin plate-shaped member, and is disposed such that a plate surface thereof is along the X direction and the Y direction. In the nozzle plate 210, the plurality of nozzles 211 described above are arranged side by side along the X direction. The droplet discharge head 200 ejects a liquid as droplets from these nozzles 211. In the embodiment, the nozzle plate 210 is made of stainless steel (SUS). The nozzle plate 210 may be formed of, for example, another type of metal such as a nickel (Ni) alloy, a resin material such as polyimide or a dry film resist, or an inorganic material such as a silicon (Si) single crystal substrate or glass ceramics.

The pressure chamber defining substrate 220 is a plate-shaped member that defines a flow path of the pressure chamber 221 and the like. The pressure chamber defining substrate 220 is, directly or via an adhesive, a thermal welding film, or the like, bonded to a surface of the nozzle plate 210 in the +Z direction. The pressure chamber defining substrate 220 is formed with a hole HL penetrating the pressure chamber defining substrate 220 in the Z direction for defining the pressure chamber 221, an ink supply path 223, and a communication portion 225. In the embodiment, the pressure chamber defining substrate 220 is formed of a Si single crystal substrate. The pressure chamber defining substrate 220 may be, for example, a substrate formed of another material containing Si as a main component, another ceramic material, a glass material, or the like. In the present specification, the main component refers to a component contained in a certain material, member, or the like at a ratio of 50% by mass or more, preferably 80% by mass or more.

In the embodiment, a plurality of pressure chambers 221 are arranged side by side along the X direction. By stacking the pressure chamber defining substrate 220 on the nozzle plate 210, the plurality of pressure chambers 221 communicate with the plurality of nozzles 211, respectively. Each pressure chamber 221 has a substantially parallelogram shape whose longitudinal direction is the Y direction when viewed from the Z direction. Ink as a liquid flows in the pressure chamber 221.

The communication portion 225 is an empty portion common to each of the plurality of pressure chambers 221, and communicates with the plurality of pressure chambers 221 and the like to form a common liquid chamber to be described later. The communication portion 225 communicates with each of the plurality of pressure chambers 221 via the ink supply path 223. The ink supply path 223 has a portion having a width smaller than that of the pressure chamber 221, and reduces a loss of pressure generated in the pressure chamber 221 and prevents an occurrence of so-called crosstalk, which is a phenomenon in which the pressure generated in each pressure chamber 221 propagates to another pressure chamber 221 via the common liquid chamber.

The piezoelectric portion 230 is formed by stacking a vibration plate 231 and a piezoelectric element 240 on the pressure chamber defining substrate 220. The piezoelectric portion 230 vibrates the vibration plate 231 provided between the piezoelectric element 240 and the pressure chamber defining substrate 220 by driving the piezoelectric element 240, and changes a volume of the pressure chamber 221. Details of the piezoelectric portion 230 will be described later. The piezoelectric portion 230 may also be referred to as a piezoelectric device or an actuator.

The sealing portion 250 is bonded onto the piezoelectric portion 230 via an adhesive. The sealing portion 250 includes a piezoelectric element holding portion 251 which is a space for holding the piezoelectric element 240, and a manifold portion 252 which communicates with the communication portion 225 of the pressure chamber defining substrate 220 to form the common liquid chamber. In the embodiment, the sealing portion 250 is formed of a Si single crystal substrate. The sealing portion 250 may be formed of another ceramic material, a glass material, or the like. In this case, the sealing portion 250 is preferably formed of a material having substantially the same thermal expansion coefficient as a thermal expansion coefficient of the pressure chamber defining substrate 220.

The drive circuit 90 supplies a drive signal for driving the piezoelectric element 240 to the piezoelectric element 240. As the drive circuit 90, for example, a circuit substrate or a semi-conductor integrated circuit (IC) can be used. The drive circuit 90 and the piezoelectric element 240 are electrically coupled to each other via a lead electrode 295 and an electric wiring (not shown). The drive circuit 90 and the control unit 110 are electrically coupled to each other via an electric wiring (not shown).

Figure 5:
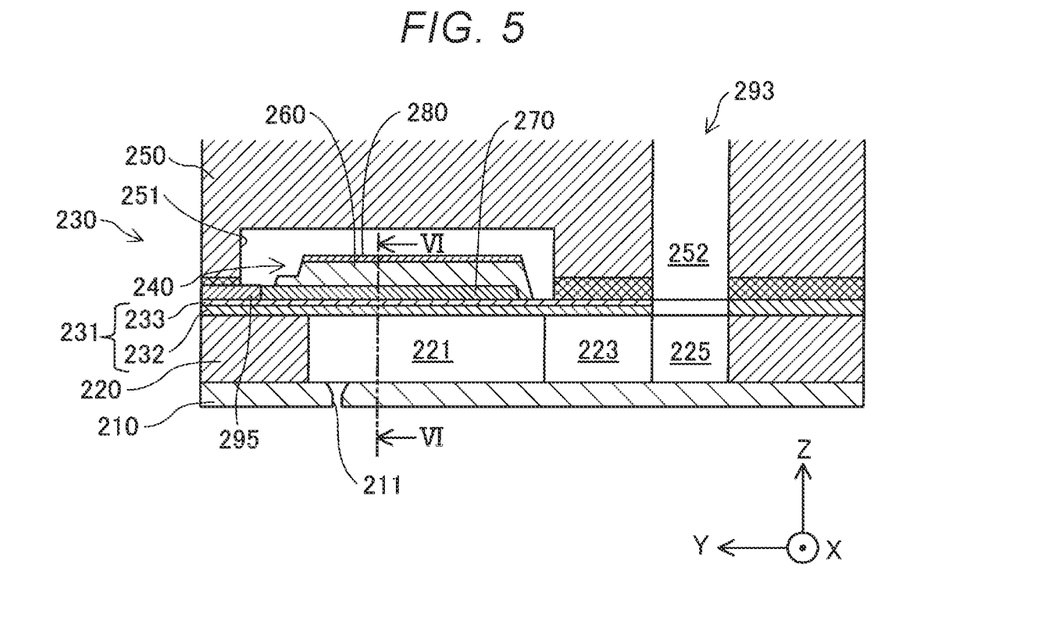
FIG. 5 is a schematic view showing a cross section of a main part of the droplet discharge head along a Y direction and a Z direction.

FIG. 5 is a schematic view showing a cross section of a main part of the droplet discharge head 200 along the Y direction and the Z direction. As shown in FIG. 5, by stacking the above-described members, the manifold portion 252 and the communication portion 225 communicate with each other, and a manifold 293 which is a common liquid chamber of each of the plurality of pressure chambers 221 is formed. Further, the nozzle 211, the pressure chamber 221, the ink supply path 223, and the manifold 293 communicate with one another, thereby forming an ink flow path. The droplet discharge head 200 discharges the liquid supplied to the pressure chamber 221 through the above-described flow path as droplets from the nozzle 211 by the piezoelectric portion 230 changing the volume of the pressure chamber 221. The manifold 293 may be referred to as the common liquid chamber or a reservoir.

Figure 6:
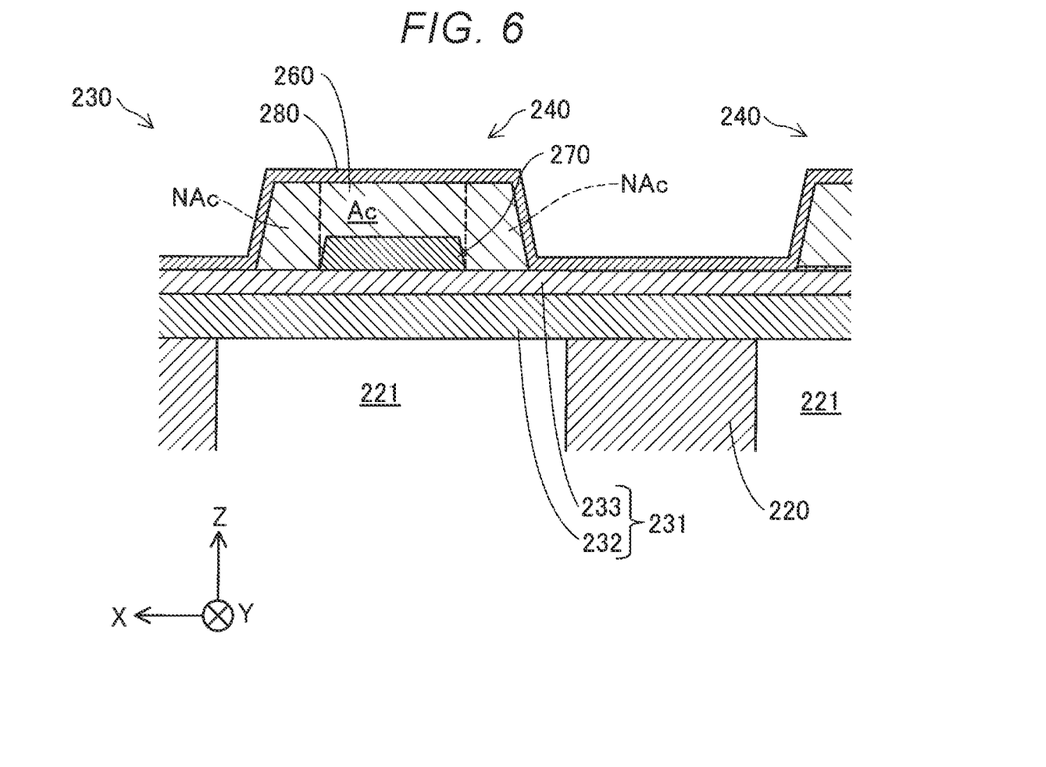
FIG. 6 is a cross-sectional view taken along a line VI-VI of a pressure chamber and a piezoelectric portion in FIG. 5.

FIG. 6 is a cross-sectional view taken along a line VI-VI of the pressure chamber 221 and the piezoelectric portion 230 in FIG. 5. As described above, the piezoelectric portion 230 includes the vibration plate 231 and the piezoelectric element 240. As shown in FIGS. 5 and 6, the piezoelectric element 240 includes a piezoelectric layer 260, a plurality of first electrodes 270, and a second electrode 280.

As shown in FIGS. 5 and 6, the vibration plate 231, the piezoelectric layer 260, the first electrode 270, and the second electrode 280 are stacked along a thickness direction of the piezoelectric layer 260, more specifically, along the Z direction. The first electrode 270 is disposed between the piezoelectric layer 260 and the vibration plate 231. The piezoelectric layer 260 is disposed between the first electrode 270 and the second electrode 280. That is, in the embodiment, the vibration plate 231, the first electrode 270, the piezoelectric layer 260, and the second electrode 280 are stacked in this order along the Z direction. In general, the droplet discharge head 200 is used when the nozzles 211 are located in a vertically downward direction as in the embodiment. In this case, the first electrode 270 is also referred to as a lower electrode, and the second electrode 280 is also referred to as an upper electrode. In other embodiments, for example, the nozzle plate 210 may function as a vibration plate.

As described above, the vibration plate 231 vibrates by driving the piezoelectric element 240. As shown in FIGS. 5 and 6, the vibration plate 231 according to the embodiment includes an elastic layer 232 and an insulating layer 233. The elastic layer 232 is located on the pressure chamber defining substrate 220 and the pressure chamber 221, and the insulating layer 233 is located on the elastic layer 232. In the embodiment, the elastic layer 232 is formed as an elastic film containing silica ($SiO_2$) as a main component, and the insulating layer 233 is formed as an insulating film containing zirconia ($ZrO_2$) as a main component. The insulating layer 233 is also referred to as a protective layer.

In the embodiment, the plurality of first electrodes 270 are individually provided for the plurality of pressure chambers 221. The second electrode 280 is provided in common to the plurality of pressure chambers 221. The electrodes provided individually for the plurality of pressure chambers 221 may be referred to as individual electrodes, and the electrode provided in common may be referred to as a common electrode. That is, in the embodiment, the first electrode 270, which is the lower electrode, is the individual electrode, and the second electrode 280, which is the upper electrode, is the common electrode. As shown in FIGS. 5 and 6, in the embodiment, the first electrodes 270 are arranged side by side along the X direction such that the longitudinal direction of each first electrode 270 is along the Y direction. The second electrode 280 is provided continuously in the X direction and the Y direction over the plurality of pressure chambers 221 so as to cover the piezoelectric layer 260 from above.

The first electrode 270 and the second electrode 280 are formed of various metals such as platinum (Pt), iridium (Ir), titanium (Ti), tungsten (W), and tantalum (Ta), a conductive metal oxide such as lanthanum nickelate ($LaNiO_3$), or the like. The first electrode 270 and the second electrode 280 may be formed of a plurality of layers made of the above-described various metals, conductive metal oxide, or the like. The first electrode 270 and the second electrode 280 may be formed of different materials.

In other embodiments, an adhesion layer that improves adhesion between the first electrode 270 and the vibration plate 231 may be provided between the first electrode 270 and the vibration plate 231. The adhesion layer is formed of titanium (Ti), titanium oxide, or the like.

As shown in FIG. 6, the piezoelectric layer 260 has a first active portion Ac and a second active portion NAc. In the embodiment, the first active portion Ac corresponds to a portion of the piezoelectric layer 260 that overlaps both the first electrode 270 and the second electrode 280 when viewed along the Z direction. The second active portion NAc corresponds to a portion of the piezoelectric layer 260 that does not overlap one or both first electrode 270 and the second electrode 280 when viewed along the Z direction.

The piezoelectric element 240 is driven by applying a voltage to the piezoelectric layer 260 via the first electrode 270 and the second electrode 280. More specifically, the piezoelectric element 240 is displaced by piezoelectric strain generated in the first active portion Ac of the piezoelectric layer 260 when the voltage is applied to the piezoelectric layer 260. The displacement of the piezoelectric element 240 causes the vibration plate 231 to vibrate, and changes the volume of the pressure chamber 221. Piezoelectric strain generated in the second active portion NAc of the piezoelectric layer 260 when the voltage is applied to the piezoelectric layer 260 is smaller than the piezoelectric strain generated in the first active portion Ac of the piezoelectric layer 260 when the voltage is applied to the piezoelectric layer 260.

The piezoelectric layer 260 contains a so-called potassium sodium niobate (KNN)-based composite oxide as a main component. The KNN-based composite oxide refers to a perovskite-type composite oxide represented by a general formula $ABO_3$ containing potassium (K), sodium (Na), and niobium (Nb). The KNN-based oxide is represented by the following formula (c1).

$(K_{1-X}, Na_X)NbO_3$ (c1)

Since the KNN-based composite oxide is a non-lead based piezoelectric material in which a content of lead (Pb) or the like is reduced, the KNN-based composite oxide is excellent in biocompatibility and has a small environmental load. In addition, since the KNN-based composite oxide is excellent in piezoelectric characteristics among non-lead based piezoelectric materials, it is advantageous for improving various characteristics. In addition, the KNN-based composite oxide has a relatively high Curie temperature as compared with other non-lead based piezoelectric materials such as BNT-BKT-BT; [(Bi,Na)TiO_3]—[(Bi,K)TiO_3]—[BaTiO_3], and is less likely to undergo depolarization due to a temperature rise, and thus, the KNN-based composite oxide can be used at a high temperature.

The "non-lead based" material may not be a material containing no Pb at all, but may be a material containing substantially no Pb, and may contain Pb as, for example, an inevitable component. From the viewpoint of reducing the environmental load, in the droplet discharge head 200, the content of Pb in the piezoelectric portion 230, that is, the content of Pb in the vibration plate 231 and the piezoelectric element 240, is preferably, for example, 0.1 mass % or less. As a result, the piezoelectric portion 230 is excellent in biocompatibility, and the environmental load due to the piezoelectric portion 230 is reduced. From the same viewpoint, it is preferable that the piezoelectric portion 230 do not substantially contain bismuth (Bi).

In the above formula (c1), a content of Na is preferably 10 mol % or more and 90 mol % or less with respect to a total amount of metal elements constituting an A site. That is, in the above formula (1), it is preferable that $0.1 \leq X \leq 0.9$. Accordingly, a composite oxide having a composition advantageous for the piezoelectric characteristics is obtained. In addition, the content of Na is preferably 30 mol % or more and 80 mol % or less, and still more preferably 40 mol % or more and 75 mol % or less with respect to the total amount of metal elements constituting the A site. That is, in the above formula (1), it is more preferable that $0.3 \leq X \leq 0.8$, and it is still more preferable that $0.4 \leq X \leq 0.75$.

Accordingly, a composite oxide having a composition more advantageous for the piezoelectric characteristics is obtained.

Alkali metals at the A site of the KNN, that is, K and Na, may be added excessively with respect to a stoichiometric composition, or may be insufficient with respect to the stoichiometric composition. Therefore, the composite oxide in the embodiment can also be expressed by the following formula (c2).

$(K_{M(1-X)}, Na_{MX})NbO_3$ (c2)

In the formula (c2), M represents an amount of the alkali metal that is excessively added or insufficient with respect to the stoichiometric composition. For example, when M=1.1, it means that when the amount of K and Na in the stoichiometric composition is 100 mol %, a total of 110 mol % of K and Na is contained. When M=0.9, it means that when the amount of K and Na in the stoichiometric composition is 100 mol %, a total of 90 mol % of K and Na is contained. When the alkali metal at the A site is not excessive or insufficient with respect to the stoichiometric composition, A=1.0. From the viewpoint of improving the characteristics of the piezoelectric layer 260, it is preferable that $0.85 \leq A \leq 1.20$, it is more preferable that $0.90 \leq A \leq 1.15$, and it is still more preferable that $0.95 \leq A \leq 1.10$.

The piezoelectric material constituting the piezoelectric layer 260 may be a KNN-based composite oxide, and is not limited to the composition represented by the above formula (1). For example, another metal element (additive) different from potassium, sodium, and niobium may be contained in the A site or a B site of the KNN. Examples of such additives include manganese (Mn), lithium (Li), barium (Ba), calcium (Ca), strontium (Sr), zirconium (Zr), titanium (Ti), bismuth (Bi), tantalum (Ta), antimony (Sb), iron (Fe), cobalt (Co), silver (Ag), magnesium (Mg), zinc (Zn) and copper (Cu). The piezoelectric material may contain one of these other metal elements, or may contain two or more of these other metal elements. An addition amount of such an additive is preferably 20% by mass or less, more preferably 15% by mass or less, and still more preferably 10% by mass or less with respect to a total amount of elements serving as the main component. A reason for this is that the addition of the additive makes it easy to improve various characteristics of the piezoelectric layer 260 to diversify a configuration and function, while the addition of the additive makes it easy to exhibit the characteristics derived from the KNN of the piezoelectric layer 260 when the amount of the additive is smaller. Even when the piezoelectric layer 260 contains these additives, it is preferable that the piezoelectric layer 260 have an ABO tri-type perovskite structure.

The piezoelectric layer 260 preferably contains Cu, in particular, as the additive. As a result, it is possible to prevent a discharge failure of droplets in the droplet discharge head 200. The piezoelectric layer 260 preferably contains Mn, in particular, as the additive. As a result, it is possible to prevent an occurrence of a leakage current in the piezoelectric element 240. Therefore, heat generation of the piezoelectric element 240 can be prevented, and a life of the piezoelectric element 240 can be extended.

The piezoelectric layer 260 in the embodiment is formed as a polycrystalline body of the KNN-based composite oxide composed of a plurality of single crystals. Accordingly, as compared with when the piezoelectric layer 260 is formed as, for example, a single crystal body, when stress is generated in the piezoelectric element 240, the stress in a plane of the piezoelectric element 240 is likely to be dispersed and equalized, and thus stress fracture of the piezoelectric element 240 is less likely to occur, and reliability is improved.

When the piezoelectric layer 260 is formed as a polycrystalline body, the various additives described above may be contained in a grain boundary in the piezoelectric layer 260. In particular, Mn is preferably contained in the grain boundary in the piezoelectric layer 260 in a state of being, for example, a manganese oxide. As a result, it is possible to fill voids in the grain boundary in the piezoelectric layer 260, and it is possible to effectively prevent the occurrence of the leakage current when the voltage is applied to the piezoelectric element 240.

An average grain size of crystal grains in the piezoelectric layer 260 is preferably 0.15 µm or more and 3 µm or less. Accordingly, since the average grain size is 0.15 µm or more, it is possible to prevent a decrease in the piezoelectric characteristics of the piezoelectric layer 260 due to fairly small crystal grains. Therefore, the piezoelectric characteristics can be further improved. In addition, since the average grain size is 3 µm or less, it is possible to further prevent an occurrence of cracks in the piezoelectric layer 260. The average grain size of the crystal grains can be determined based on a SEM image of the piezoelectric layer 260 obtained by a scanning electron microscope (SEM). More specifically, the average grain size of the crystal grains is calculated by measuring grain sizes of, for example, 100 or more crystal grains in the SEM image of the piezoelectric layer 260 having the same magnification and calculating an arithmetic average of the measured grain sizes. In other embodiments, the average grain size of the crystal grains may be, for example, less than 0.15 µm or more than 3 µm.

The KNN may also be a mixed crystal having the ABO tri-type perovskite structure with other composite oxides different from the KNN. That is, in the present specification, the "perovskite-type composite oxide containing K, Na, and Nb" includes a piezoelectric material represented as a mixed crystal containing a composite oxide having the ABO tri-type perovskite structure containing K, Na, and Nb and another composite oxide having the ABO tri-type perovskite structure. The other composite oxide is not particularly limited, but is preferably a non-lead based piezoelectric material, so that the piezoelectric layer 260 can be formed as the non-lead based piezoelectric material. In addition, it is preferable that the composite oxide do not substantially contain bismuth (Bi).

The piezoelectric material includes a material having a composition in which a part of an element is missing, a material having a composition in which a part of an element is excessive, and a material having a composition in which a part of an element is substituted with another element. As long as basic characteristics of the piezoelectric layer 260 do not change, a material deviated from the stoichiometric composition due to deficiency or excess, or a material in which a part of an element is substituted with another element is also contained in the piezoelectric material according to the embodiment.

In the piezoelectric element 240, it is preferable that a thickness of the elastic layer 232 be 0.1 µm or more and 2.0 µm or less, a thickness of the insulating layer 233 be 0.01 µm or more and 1.0 µm or less, a thickness of the piezoelectric layer 260 be 0.1 µm or more and 5.0 µm or less, a thickness of the first electrode 270 be 0.01 µm or more and 1.0 µm or less, and a thickness of the second electrode 280 be 0.01 µm or more and 1.0 µm or less. It should be noted that the thickness of each of these elements is an example, and can be changed within a range that does not change the gist of the present disclosure.

When the piezoelectric portion 230 in the embodiment is manufactured, first, the vibration plate 231 is prepared. The elastic layer 232 of the vibration plate 231 is formed at the pressure chamber defining substrate 220 by, for example, thermally oxidizing the Si substrate, more specifically, the pressure chamber defining substrate 220 in which the holes HL are not formed. The insulating layer 233 is formed at the elastic layer 232 by, for example, a CVD method. Accordingly, the vibration plate 231 is formed. In other embodiments, the elastic layer 232 may be formed at the pressure chamber defining substrate 220 by, for example, the CVD method. The holes HL of the pressure chamber defining substrate 220 are formed by, for example, anisotropic etching using an alkaline solution such as potassium hydroxide (KOH) after the vibration plate 231 is formed at the pressure chamber defining substrate 220. More specifically, in the embodiment, the holes HL are formed after the completion of the piezoelectric portion 230.

Next, the first electrode 270 is formed at the vibration plate 231 by patterning by sputtering, etching, or the like.

Next, the piezoelectric layer 260 is formed at the first electrode 270 and the vibration plate 231. The piezoelectric layer 260 in the embodiment is formed in a thin film shape by a solution method such as an MOD method or a sol-gel method. The solution method such as the MOD method or the sol-gel method is also referred to as a wet method or a liquid phase method. By forming the piezoelectric layer 260 by the solution method in this manner, productivity of the piezoelectric layer 260 can be increased. In other embodiments, the piezoelectric layer 260 may be formed by, for example, a gas phase method such as sputtering or a solid phase method such as powder compacting.

When the piezoelectric layer 260 is formed by the solution method, for example, first, a precursor solution containing a predetermined metal complex is prepared. The precursor solution is a sol or a solution containing a metal element as a raw material of the piezoelectric layer 260, and is, for example, a solution obtained by dissolving or dispersing a metal complex capable of forming a composite oxide containing K, Na, and Nb by firing in an organic solvent. When the above additive such as Cu or Mn is added to the piezoelectric layer 260, a metal complex or the like containing the additive may be further mixed with the precursor solution.

Examples of the metal complex containing K include potassium 2-ethylhexanoate and potassium acetate. Examples of the metal complex containing Na include sodium 2-ethylhexanoate and sodium acetate. Examples of metal complex containing Nb include niobium 2-ethylhexanoate and niobium pentaethoxy. When Mn is added as the additive, examples of the metal complex containing Mn include manganese 2-ethylhexanoate. When Cu is added as the additive, examples of metal complex containing Cu include copper acetate. Two or more metal complexes may be used in combination. For example, potassium 2-ethylhexanoate and potassium acetate may be used in combination as the metal complex containing K. Examples of the solvent include 2-n-butoxyethanol, n-octane, and mixed solvents thereof. The precursor solution may contain an additive that stabilizes the dispersion of the metal complex containing K, Na, and Nb. Examples of such additives include 2-ethylhexanoic acid.

After the above-described precursor solution is prepared, a coating step of coating the first electrode 270 and the vibration plate 231 with the precursor solution to form a precursor film is executed. In the coating step, the first electrode 270 and the vibration plate 231 are coated with the precursor solution by, for example, a spin coating method. Next, a drying step of heating the precursor film at a predetermined temperature, for example, about 130° C. to 250° C. and drying the precursor film for a certain period of time is executed. Next, a degreasing step of degreasing the dried precursor film by heating the dried precursor film at a predetermined degreasing temperature, for example, 300° C. to 450° C. is executed. Then, a firing step of crystallizing the degreased precursor film by heating the degreased precursor film at a higher predetermined firing temperature, for example, 600° C. to 800° C. is executed. Examples of a heating device used in the drying step, the degreasing step, and the firing step include a rapid thermal annealing (RTA) device that performs heating by irradiation with an infrared lamp and a hot plate. By executing the coating step to the firing step described above, a piezoelectric film formed of KNN as a main component and formed as a polycrystalline body is formed. Further, in the firing step, Mn contained in the precursor solution is precipitated at the grain boundary between the KNN crystals.

The piezoelectric layer 260 in the embodiment is formed by repeatedly executing the coating step to the firing step a plurality of times to form a plurality layers of piezoelectric films. In the embodiment, a portion of the piezoelectric layer 260 formed at the first electrode 270 corresponds to the above-described first active portion Ac, and a portion of the piezoelectric layer 260 formed not on the first electrode 270 but on the vibration plate 231 corresponds to the above-described second active portion NAc. In a series of steps from the coating step to the firing step, the firing step may be performed after repeating the steps from the coating step to the degreasing step a plurality of times. A heating rate in the drying step is preferably 30° C./sec to 350° C./sec. In the solution method, by firing the piezoelectric film at such a heating rate, the piezoelectric layer 260 which is not a pseudo-cubic crystal can be formed. The term "heating rate" as used herein defines a rate of change over time in the temperature from the degreasing temperature to the firing temperature in the firing step.

Thereafter, the piezoelectric layer 260 including a plurality of piezoelectric films is patterned. Dry etching such as reactive ion etching or ion milling, and wet etching using an etching solution are performed as the patterning. Thereafter, the second electrode 280 is formed at the piezoelectric layer 260 by, for example, the same method as that of the first electrode 270. Before and after the second electrode 280 is formed at the piezoelectric layer 260, reheating treatment may be appropriately performed in a temperature range of 600° C. to 800° C. By performing the reheating treatment in this manner, it is possible to form a good interface between the piezoelectric layer 260 and the first electrode 270 or between the piezoelectric layer 260 and the second electrode 280, and to improve crystallinity of the piezoelectric layer 260. The reheating treatment is also referred to as post-annealing.

Through the above steps, the piezoelectric element 240 including the first electrode 270, the piezoelectric layer 260, and the second electrode 280, and the piezoelectric portion 230 including the vibration plate 231 are completed. In each of the steps described above, for example, etching may be appropriately performed in order to smooth a surface of each member or adjust the thickness.

The inventors of the present disclosure intensively studied improvement in image quality of printing performed by the droplet discharge head 200 and extension of the life of the droplet discharge head 200. As a result, it is found that in the droplet discharge head 200, when the number of paths n, a piezoelectric constant $d_{31}$ [m/v] of the piezoelectric element 240, and a ratio x of Na in the piezoelectric layer 260 satisfy a relationship represented by the following formula (1), good image quality and long life can be implemented.

$$8.0 \times 10^{-8} \leq n \cdot d_{31} \cdot x \leq 9.6 \times 10^{-6} \quad (1)$$

More specifically, the ratio x represents a ratio of a Na molar fraction to a total value of a K molar fraction and the Na molar fraction in the piezoelectric layer 260. That is, the ratio x is the same value as X in the above formula (c1). Hereinafter, $n \cdot d_{31} \cdot x$ is also referred to as a parameter $P_1$.

The inventors of the present disclosure further found that, the piezoelectric layer 260 contains Cu, and the number of paths n, the piezoelectric constant $d_{31}$, the ratio x, and an atomic percentage y [at %] of Cu in the piezoelectric layer 260 satisfy a relationship represented by the following formula (2), it is possible to prevent a discharge failure of the droplet discharge head 200, and it is possible to implement even better image quality. Hereinafter, $n \cdot d_{31} \cdot x \cdot y$ is also referred to as a parameter $P_2$.

$$8.0 \times 10^{-9} \leq n \cdot d_{31} \cdot x \cdot y \leq 1.9 \times 10^{-5} \quad (2)$$

The inventors of the present disclosure further found that, when the piezoelectric layer 260 contains Mn and the number of paths n, the piezoelectric constant $d_{31}$, the ratio x, and an atomic percentage z [at %] of Mn in the piezoelectric layer 260 satisfy a relationship represented by the following formula (3), it is possible to implement a further longer life of the droplet discharge head 200. Hereinafter, $n \cdot d_{31} \cdot x \cdot z$ is also referred to as a parameter $P_3$.

$$8.0 \times 10^{-9} \leq n \cdot d_{31} \cdot x \cdot z \leq 1.9 \times 10^{-5} \quad (3)$$

In order to verify an effect of the droplet discharge head 200 in the embodiment, a plurality of samples were evaluated by a performance evaluation test. More specifically, a plurality of samples belonging to a sample group Sg1, a plurality of samples belonging to a sample group Sg2, and a plurality of samples belonging to a sample group Sg3 were used as the samples of the performance evaluation test. As the performance evaluation test, an image quality evaluation test and a life evaluation test were performed. In the image quality evaluation test and the life evaluation test, image quality and a life of each sample were evaluated by executing the multi-path recording using each sample. Details of the image quality evaluation test and the life evaluation test will be described below.

As the samples belonging to the sample group Sg1, the droplet discharge head 200 including the piezoelectric element 240 having the piezoelectric layer 260 to which the additive described above was not added was used. Among the samples belonging to the sample group Sg1, a part of or all of the number of paths n, the piezoelectric constant $d_{31}$, and the ratio x described above were made different from one another. As the samples belonging to the sample group Sg2, the droplet discharge head 200 including the piezoelectric element 240 having the piezoelectric layer 260 to which Cu was added as the additive was used. Among the samples belonging to the sample group Sg2, a part of or all of the number of paths n, the piezoelectric constant $d_{31}$, the ratio x, and the atomic percentage y described above were made different from one another. As the samples belonging to the sample group Sg3, the droplet discharge head 200 including the piezoelectric element 240 having the piezoelectric layer 260 to which Mn was added as the additive was used. Among the samples belonging to the sample group Sg3, a part of or all of the number of paths n, the piezoelectric constant $d_{31}$, the ratio x, and the atomic percentage z described above were made different from one another.

The piezoelectric portion 230 of the droplet discharge head 200 as a sample belonging to each sample group was prepared by the procedure described above. Specifically, first, the first electrode 270 was formed at the insulating layer 233 of the vibration plate 231 by sputtering and etching. Next, a coating step was executed using a sol containing a raw material of the piezoelectric layer 260 as the precursor solution, and then the drying step, the degreasing step, and the firing step were executed to form the piezoelectric film. Thereafter, the coating step to the firing step were repeated to form the piezoelectric layer 260 including a plurality of layers of piezoelectric films. Then, the second electrode 280 was formed at the piezoelectric layer 260 by, for example, the same method as that of the first electrode 270. When the piezoelectric portions 230 of the samples belonging to the sample group Sg2 were prepared, a precursor solution containing Cu was used as the precursor solution. When the piezoelectric portions 230 of the samples belonging to the sample group Sg3 were prepared, a precursor solution containing Mn was used as the precursor solution. In addition, the piezoelectric portion 230 of the sample belonging to each sample group was prepared as the piezoelectric portion 230 not containing Pb.

The ratio x of Na, the atomic percentage y of Cu, and the atomic percentage z of Mn described above were adjusted by adjusting an amount of each raw material charged into the precursor solution. Thus, in each sample, the ratio x was adjusted to 0.3 or more and 0.8 or less, the atomic percentage y was adjusted to a value of 0.01 or more and 2.50 or less, and the atomic percentage z was adjusted to 0.01 or more and 2.50 or less. The ratio x, the atomic percentage y, and the atomic percentage z in the completed piezoelectric element 240 were measured by energy dispersive X-ray spectroscopy (EDX) analysis. For the EDX analysis, JEM-ARM200F manufactured by JEOL Ltd. was used.

In the image quality evaluation test, a mixed color black ink was discharged from the droplet discharge head 200 for each sample, an image having a highlight portion and a shadow portion was printed on a white printing paper, and a degree of graininess in the highlight portion and a degree of blurring and bleeding in the shadow portion were visually evaluated. Print data for printing an image in the image quality evaluation test was the same among the samples. The higher the graininess in a certain portion of the image, the stronger roughness and unevenness when the portion is visually recognized. The mixed color black ink is ink exhibiting black by mixing cyan, yellow, and magenta colors, and is also referred to as a composite black ink.

In the image quality evaluation test, when neither the graininess in the highlight portion nor the blurring and bleeding in the shadow portion was recognized, an evaluation result was "A". When any one of the graininess in the highlight portion and the blurring and bleeding in the shadow portion was hardly recognized and the other one was slightly recognized, the evaluation result was "B". When both the graininess in the highlight portion and the blurring and bleeding in the shadow portion were slightly recognized, the evaluation result was "C". When at least one of the graininess in the highlight portion and the blurring and bleeding in the shadow portion was remarkably recognized, the evaluation result was "D".

In the life evaluation test, a first piezoelectric constant representing the piezoelectric constant $d_{31}$ of the piezoelectric element 240 of the droplet discharge head 200 immediately after the manufacture and a second piezoelectric constant representing the piezoelectric constant $d_{31}$ of the piezoelectric element 240 of the droplet discharge head 200 after 10,000 times of use were compared for each sample. Each of the first piezoelectric constant and the second piezoelectric constant was calculated based on a measurement result of displacement due to piezoelectric strain of a strip sample. More specifically, first, the piezoelectric element 240 was cut into a strip shape having a length of 15 mm and a width of 4 mm when viewed along the Z direction, thereby preparing the strip sample. Next, when one end portion of the strip sample in a longitudinal direction was fixed, a voltage waveform having a sine difference of 0 V, a positive voltage, and 0 V was continuously applied to one electrode of the strip sample to cause the piezoelectric strain in the strip sample. At this time, displacement of an end portion of the strip sample on an opposite side to the fixed end portion was measured by a laser displacement meter, and the piezoelectric constant was calculated based on the measured displacement. The first piezoelectric constant was used as the piezoelectric constant $d_{31}$ in the above formulae (1) to (3).

In the life evaluation test, the evaluation result was "A" when a ratio of the second piezoelectric constant to the first piezoelectric constant was 0.95 or more, the evaluation result was "B" when the ratio was 0.90 or more and less than 0.95, the evaluation result was "C" when the ratio was 0.80 or more and less than 0.90, and the evaluation result was "D" when the ratio was less than 0.80.

Note that the certain droplet discharge head 200 after "10,000 times of use" refers to that printing similar to the image quality evaluation test described above is executed 10,000 times by the droplet discharge head 200. In addition, in the image quality evaluation test and the life evaluation test, the number of paths n in each sample was set to any number of paths of 2 or more and 70 or less.

Figure 7:
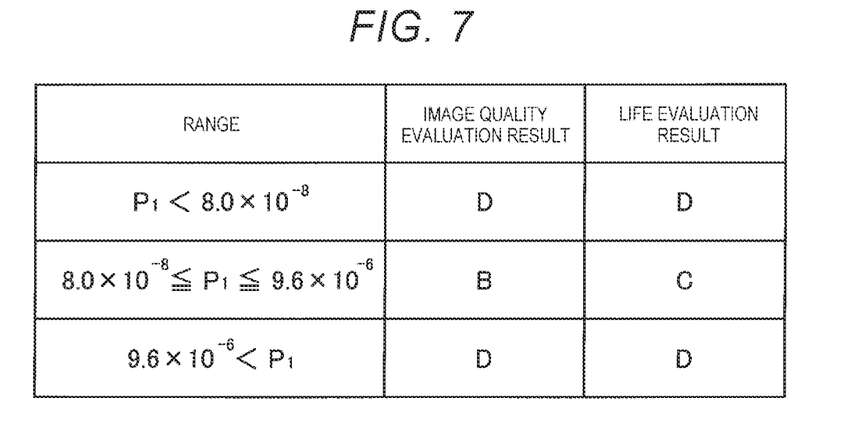
FIG. 7 is a first diagram showing results of performance evaluation tests of the droplet discharge head.

FIG. 7 is a first diagram showing results of the performance evaluation tests of the droplet discharge head 200 in the embodiment. FIG. 7 shows a performance evaluation result of the sample group Sg1 described above. As shown in FIG. 7, in the sample group Sg1, when the parameter $P_1$ was less than $8.0 \times 10^{-8}$, the evaluation results of the image quality and the life were both D. Similarly, when the parameter $P_1$ exceeded $9.6 \times 10^{-6}$, the evaluation results of the image quality and the life were both D. On the other hand, when the parameter $P_1$ was $8.0 \times 10^{-8}$ or more and $9.6 \times 10^{-6}$ or less, the evaluation result of the image quality was B, and the evaluation result of the life was C. That is, it was found that when the number of paths n, the piezoelectric constant $d_{31}$, and the ratio x satisfy the relationship represented by the above formula (1), good image quality and long life are implemented.

Figure 8:
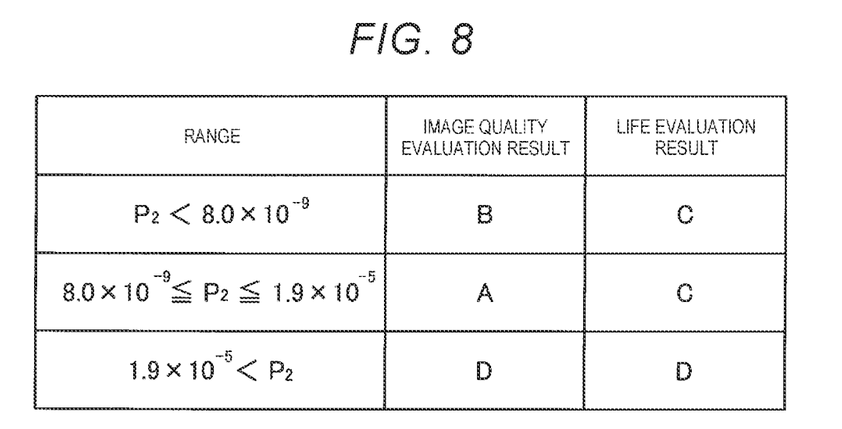
FIG. 8 is a second diagram showing results of the performance evaluation tests of the droplet discharge head.

FIG. 8 is a second diagram showing results of the performance evaluation tests of the droplet discharge head 200 in the embodiment. FIG. 8 shows performance evaluation results of samples satisfying the relationship of the above formula (1) in the sample group Sg2. As shown in FIG. 8, when the parameter $P_2$ was less than $8.0 \times 10^{-9}$, the evaluation result of the image quality was B, and the evaluation result of the life was C. In addition, when the parameter $P_2$ exceeded $1.9 \times 10^{-5}$, the evaluation results of the image quality and the life were both D. On the other hand, when the parameter $P_2$ was $8.0 \times 10^{-9}$ or more and $1.9 \times 10^{-5}$ or less, the evaluation result of the image quality was A, and the evaluation result of the life was C. That is, it was found that when the number of paths n, the piezoelectric constant $d_{31}$, the ratio x, and the atomic percentage y satisfy the relationship represented by the above formula (2), even better image quality is implemented. This is considered to be an effect due to the prevention of the discharge failure by the addition of Cu to the piezoelectric layer 260. Although not shown, the evaluation results of the image quality and the life of the samples that do not satisfy the relationship of the above formula (1) in the sample group Sg2 were both D.

Figure 9:
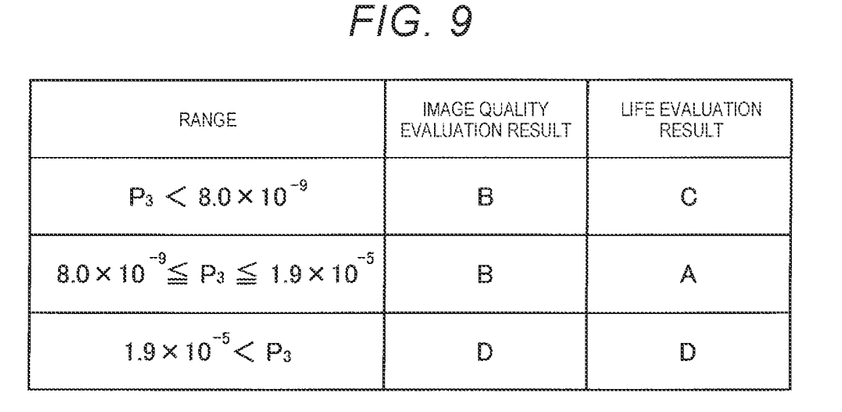
FIG. 9 is a third diagram showing results of the performance evaluation tests of the droplet discharge head.

FIG. 9 is a third diagram showing results of the performance evaluation tests of the droplet discharge head 200 in the embodiment. FIG. 9 shows performance evaluation results of samples satisfying the relationship of the above formula (1) in the sample group Sg3. As shown in FIG. 9, when the parameter $P_3$ was less than $8.0 \times 10^{-9}$, the evaluation result of the image quality was B, and the evaluation result of the life was C. In addition, when the parameter $P_3$ exceeded $1.9 \times 10^{-5}$, the evaluation results of the image quality and the life were both D. On the other hand, when the parameter $P_3$ was $8.0 \times 10^{-9}$ or more and $1.9 \times 10^{-5}$ or less, the evaluation result of the image quality was B, and the evaluation result of the life was A. That is, it was found that when the number of paths n, the piezoelectric constant $d_{31}$, the ratio x, and the atomic percentage z satisfy the relationship represented by the above formula (3), even better image quality and longer life are implemented. This is considered to be an effect due to the prevention of the occurrence of the leakage current and the prevention of heat generation of the piezoelectric layer 260 by the addition of Mn to the piezoelectric layer 260. Although not shown, the evaluation results of the image quality and the life of the samples that do not satisfy the relationship of the above formula (1) in the sample group Sg3 were both D.

The parameter $P_1$, the parameter $P_2$, and the parameter $P_3$ may be referred to during manufacturing the droplet discharge head 200, or may be referred to during using the droplet discharge head 200, for example. For example, when the number of paths n is determined in advance, the piezoelectric constant $d_{31}$, the ratio x, the atomic percentage y, and the atomic percentage z can be adjusted so as to satisfy the relationships represented by the above formulas (1), (2), and (3) with respect to the predetermined number of paths n during manufacturing the droplet discharge head 200. The number of paths n in this case may be determined as, for example, a range having a lower limit value and an upper limit value, and in a case of determining the number of paths n in this way, the piezoelectric constant $d_{31}$, the ratio x, the atomic percentage y, and the atomic percentage z may be adjusted so as to satisfy the relationships represented by the formula (1), the formula (2), and the formula (3), regardless of how the number of paths n is changed within a predetermined range. As a result, it is possible to manufacture the droplet discharge head 200 including the piezoelectric element 240 having a preferable composition and piezoelectric characteristics. In addition, for example, when the droplet discharge head 200 including the piezoelectric element 240 having an identified piezoelectric constant $d_{31}$, an identified ratio x, or the like is used, the control unit 110 may adjust the range of the number of paths n so as to satisfy the relationship represented by the above formula (1) or the like.

According to the droplet discharge head 200 in the embodiment described above, the number of paths n, the piezoelectric constant $d_{31}$, and the ratio x of Na satisfy the relationship represented by the above formula (1). As a result, in the droplet discharge head 200 for performing the multi-path recording, it is possible to implement good image quality and long life of the droplet discharge head 200 by considering the relationship between the number of paths n, the component of the piezoelectric layer 260, and the piezoelectric characteristics.

In the embodiment, the piezoelectric layer 260 contains copper, and the number of paths n, the piezoelectric constant $d_{31}$, and the ratio x of Na, and an atomic percentage y of copper satisfy a relationship represented by the above formula (2). As a result, it is possible to prevent a discharge failure and to implement even better image quality.

In the embodiment, the piezoelectric layer 260 contains manganese, and the number of paths n, the piezoelectric constant $d_{31}$, and the ratio x of Na, and an atomic percentage z of manganese satisfy a relationship represented by the above formula (3). As a result, it is possible to prevent an occurrence of a leakage current in the piezoelectric layer 260. Therefore, a life of the droplet discharge head 200 can be further extended, and a discharge failure caused by heat generation of the piezoelectric layer 260 can be prevented.

In the embodiment, manganese is contained in the grain boundary of the piezoelectric layer 260 having a polycrystalline structure. As a result, it is possible to reduce voids in the grain boundary in the piezoelectric layer, and it is possible to implement a further longer life of the droplet discharge head 200.

In the embodiment, an average grain size of crystal grains in the piezoelectric layer 260 is 0.15 µm or more and 3 µm or less. As a result, since the average grain size is 0.15 µm or more, piezoelectric characteristics of the piezoelectric layer 260 can be further improved. In addition, since the average grain size is 3 µm or less, it is possible to further prevent an occurrence of cracks in the piezoelectric layer 260.

B. Other Embodiments

The present disclosure is not limited to the embodiments described above, and can be implemented in various forms without departing from the scope of the present disclosure. For example, the present disclosure can be implemented in the following aspects. In order to solve a part of or all of problems of the present disclosure, or in order to achieve a part of or all of effects of the present disclosure, technical features of the above embodiments corresponding to technical features in the following aspects can be replaced or combined appropriately. Technical features can be deleted appropriately unless the technique features are described as essential in the present specification.

(1) According to a first aspect of the present disclosure, there is provided a droplet discharge head that executes, between sub scans in which a medium is conveyed in a sub scanning direction intersecting a main scanning direction, a main scan in which droplets are discharged onto a main scanning line by movement in the main scanning direction with respect to the medium, thereby performing multi-path recording in which dots are formed in the medium and dot recording in the main scanning line is completed by n main scans when n is an integer of 2 or more. The droplet discharging head includes: a plurality of nozzles configured to discharge a liquid as the droplets; a pressure chamber defining substrate defining a pressure chamber communicating with the nozzles; a piezoelectric element; and a vibration plate disposed between the pressure chamber defining substrate and the piezoelectric element, forming a part of a wall surface of the pressure chamber, and configured to vibrate by driving of the piezoelectric element. The piezoelectric element includes a first electrode, a second electrode, and a piezoelectric layer disposed between the first electrode and the second electrode, the piezoelectric layer containing a perovskite-type composite oxide containing potassium, sodium, and niobium as a main component. The number of paths n in the multi-path recording, a piezoelectric constant $d_{31}$ [m/v] of the piezoelectric element, and a ratio x of a sodium molar fraction to a total value of a potassium molar fraction and the sodium molar fraction in the piezoelectric layer satisfy a relationship represented by a following formula (1).

$$8.0 \times 10^{-8} \leq n \cdot d_{31} \cdot x \leq 9.6 \times 10^{-6} \qquad (1)$$

According to such an aspect, in the droplet discharge head for performing the multi-path recording, it is possible to implement good image quality and long life of the droplet discharge head by considering the relationship between the number of paths, the component of the piezoelectric layer, and the piezoelectric characteristics.

(2) In the above aspect, the piezoelectric layer contains copper, and the number of paths n, the piezoelectric constant $d_{31}$ [m/v], the ratio x, and an atomic percentage y [at %] of copper in the piezoelectric layer satisfy a relationship represented by a following formula (2).

$$8.0 \times 10^{-9} \leq n \cdot d_{31} \cdot x \cdot y \leq 1.9 \times 10^{-5} \qquad (2)$$

According to such an aspect, it is possible to prevent a discharge failure and to implement even better image quality.

(3) In the above aspect, the piezoelectric layer contains manganese, and the number of paths n, the piezoelectric constant $d_{31}$ [m/v], the ratio x, and an atomic percentage z [at %] of manganese in the piezoelectric layer satisfy a relationship represented by a following formula (3).

$$8.0 \times 10^{-9} \leq n \cdot d_{31} \cdot x \cdot z \leq 1.9 \times 10^{-5} \qquad (3)$$

According to such an aspect, it is possible to prevent an occurrence of a leakage current in the piezoelectric layer. Therefore, a life of the droplet discharge head can be further extended, and a discharge failure caused by heat generation of the piezoelectric layer can be prevented.

(4) In the above aspect, the piezoelectric layer is a polycrystalline body, and manganese is contained in a grain boundary in the piezoelectric layer. According to such an aspect, it is possible to reduce voids in the grain boundary in the piezoelectric layer, and it is possible to implement a further longer life of the droplet discharge head.

(5) In the above aspect, an average grain size of crystal grains in the piezoelectric layer is 0.15 μm or more and 3 μm or less. According to such an aspect, since the average grain size is 0.15 μm or more, the piezoelectric characteristics of the piezoelectric layer can be further improved. In addition, since the average grain size is 3 μm or less, it is possible to further prevent an occurrence of cracks in the piezoelectric layer.

(6) A second aspect of the present disclosure provides a droplet discharge apparatus. The droplet discharge apparatus includes: the droplet discharge head of the above aspect; a conveyance mechanism configured to convey the medium in the sub scanning direction; a head moving mechanism configured to support the droplet discharge head and moves the droplet discharge head in the main scanning direction; and a control unit configured to control the droplet discharge head, the conveyance mechanism, and the head moving mechanism to execute the multi-path recording.

What is claimed is:

1. A droplet discharge head that executes, between sub scans in which a medium is conveyed in a sub scanning direction intersecting a main scanning direction, a main scan in which droplets are discharged onto a main scanning line by movement in the main scanning direction with respect to the medium, thereby performing multi-path recording in which dots are formed in the medium and dot recording in the main scanning line is completed by n main scans when n is an integer of 2 or more, the droplet discharge head comprising:

a plurality of nozzles configured to discharge a liquid as the droplets;
a pressure chamber defining substrate defining a pressure chamber communicating with the nozzles;
a piezoelectric element including a first electrode, a second electrode, and a piezoelectric layer disposed between the first electrode and the second electrode, the piezoelectric layer containing a perovskite-type composite oxide containing potassium, sodium, and niobium as a main component; and
a vibration plate disposed between the pressure chamber defining substrate and the piezoelectric element, forming a part of a wall surface of the pressure chamber, and configured to vibrate by driving of the piezoelectric element, wherein
the number of paths n in the multi-path recording, a piezoelectric constant $d_{31}$ [m/v] of the piezoelectric element, and a ratio x of a sodium molar fraction to a total value of a potassium molar fraction and the sodium molar fraction in the piezoelectric layer satisfy a relationship represented by a following formula (1).

$$8.0 \times 10^{-8} \leq n \cdot d_{31} \cdot x \leq 9.6 \times 10^{-6} \qquad (1)$$

2. The droplet discharging head according to claim 1, wherein
the piezoelectric layer contains copper, and
the number of paths n, the piezoelectric constant $d_{31}$, the ratio x, and an atomic percentage y [at %] of copper in the piezoelectric layer satisfy a relationship represented by a following formula (2).

$$8.0 \times 10^{-9} \leq n \cdot d_{31} \cdot x \cdot y \leq 1.9 \times 10^{-5} \qquad (2)$$

3. The droplet discharging head according to claim 1, wherein
the piezoelectric layer contains manganese, and
the number of paths n, the piezoelectric constant $d_{31}$, the ratio x, and an atomic percentage z [at %] of manganese in the piezoelectric layer satisfy a relationship represented by a following formula (3).

$$8.0 \times 10^{-9} \leq n \cdot d_{31} \cdot x \cdot z \leq 1.9 \times 10^{-5} \qquad (3)$$

4. The droplet discharging head according to claim 3, wherein
the piezoelectric layer is a polycrystalline body, and
manganese is contained in a grain boundary in the piezoelectric layer.

5. The droplet discharging head according to claim 4, wherein
an average grain size of crystal grains in the piezoelectric layer is 0.15 μm or more and 3 μm or less.

6. A droplet discharge apparatus comprising:
the droplet discharging head according to claim 1;
a conveyance mechanism configured to convey the medium in the sub scanning direction;
a head moving mechanism configured to support the droplet discharge head and moves the droplet discharge head in the main scanning direction; and a control unit configured to control the droplet discharge head, the conveyance mechanism, and the head moving mechanism to execute the multi-path recording.

* * * * *